(12) United States Patent
Aoki et al.

(10) Patent No.: US 7,684,190 B2
(45) Date of Patent: Mar. 23, 2010

(54) HEAT SINK WITH NON-UNIFORM FINS AND TRANSVERSE PROTRUSION

(75) Inventors: Michimasa Aoki, Kawasaki (JP); Masumi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/745,538

(22) Filed: Dec. 29, 2003

(65) Prior Publication Data

US 2004/0141290 A1 Jul. 22, 2004

(30) Foreign Application Priority Data

Jan. 17, 2003 (JP) ............................. 2003-009688

(51) Int. Cl.
 *H05K 7/20* (2006.01)
(52) U.S. Cl. .................. 361/695; 361/697; 361/704; 174/16.1; 174/16.3; 257/722; 165/80.3; 165/185
(58) Field of Classification Search ................. 361/695, 361/697, 704, 687, 703, 717–719; 257/718, 257/722; 174/16.1, 16.3; 165/80.3, 185, 165/122
See application file for complete search history.

(56) References Cited

U.S. PATENT DOCUMENTS

| | | | | |
|---|---|---|---|---|
| 5,526,875 A * | 6/1996 | Lin ............................ | 165/80.3 |
| 5,548,482 A * | 8/1996 | Hatauchi et al. ............. | 361/720 |
| 5,727,624 A * | 3/1998 | Ko et al. ....................... | 165/121 |
| 5,867,365 A * | 2/1999 | Chiou ......................... | 361/690 |
| 6,101,091 A * | 8/2000 | Baik ............................ | 361/704 |
| 6,101,096 A * | 8/2000 | MacGregor et al. ........ | 361/720 |
| 6,180,436 B1 * | 1/2001 | Koors et al. ................. | 438/117 |
| 6,301,901 B1 * | 10/2001 | Coffee et al. ................. | 62/3.7 |
| 6,327,148 B1 * | 12/2001 | Tucker et al. ............... | 361/704 |
| 6,333,852 B1 * | 12/2001 | Lin ............................ | 361/697 |
| 6,348,748 B1 * | 2/2002 | Yamamoto ................. | 310/62 |
| 6,373,699 B1 * | 4/2002 | Chen ......................... | 361/697 |
| 6,382,306 B1 * | 5/2002 | Hsu .......................... | 165/80.3 |
| 6,397,941 B1 * | 6/2002 | McCullough .............. | 165/185 |
| 6,446,708 B1 * | 9/2002 | Lai ............................ | 165/80.3 |
| 6,522,528 B2 | 2/2003 | Yamane | |

(Continued)

FOREIGN PATENT DOCUMENTS

JP 4-309294 10/1992

(Continued)

OTHER PUBLICATIONS

Office Action in Japanese priority application 2003-009688.

(Continued)

*Primary Examiner*—Boris L Chervinsky
(74) *Attorney, Agent, or Firm*—Westerman, Hattori, Daniels & Adrian, LLP

(57) ABSTRACT

A heat sink includes a generally rectangular flat base, a plurality of fins provided on the surface of the base in parallel to each other, a protrusion provided on the surface of the base along substantially the overall width of the base in the transverse direction to the fins. The fins become gradually shorter on one end side of the base. The ends of the fins are arranged on an oblique line with respect to a line perpendicular to the fins.

30 Claims, 11 Drawing Sheets

U.S. PATENT DOCUMENTS

| | | | |
|---|---|---|---|
| 6,529,375 B2 * | 3/2003 | Miyahara et al. | 361/697 |
| 6,621,699 B2 * | 9/2003 | Watanabe et al. | 361/697 |
| 6,657,860 B2 * | 12/2003 | Matsui et al. | 361/695 |
| 6,681,845 B1 * | 1/2004 | Yeh et al. | 165/122 |
| 6,691,769 B2 * | 2/2004 | Johnson et al. | 165/80.3 |
| 6,711,015 B2 * | 3/2004 | Syring et al. | 361/695 |
| 6,735,864 B2 * | 5/2004 | Sato et al. | 29/890.03 |
| 6,778,390 B2 * | 8/2004 | Michael | 361/695 |
| 6,982,877 B2 * | 1/2006 | Vinson et al. | 361/719 |
| 7,031,162 B2 * | 4/2006 | Arvelo et al. | 361/718 |
| 2002/0003690 A1 * | 1/2002 | Lin et al. | 361/697 |

FOREIGN PATENT DOCUMENTS

| | | |
|---|---|---|
| JP | 2007-007110 | 1/1995 |
| JP | 10-209351 | 8/1998 |
| JP | 11-40967 | 2/1999 |
| JP | 2000-3072248 | 7/2000 |
| JP | 2000-294695 | 10/2000 |
| JP | 2000-353889 | 12/2000 |
| JP | 2000353889 A * | 12/2000 |
| JP | 2001-15969 | 1/2001 |
| JP | 2001-274575 | 10/2001 |
| JP | 2002-64167 | 2/2002 |
| JP | 2002-134973 | 5/2002 |
| JP | 2002-293202 A | 10/2002 |

OTHER PUBLICATIONS

Office Action dated Sept. 11, 2007 Search Report issued in corresponding Japanese priority application 2003-009688.

* cited by examiner

HEAT SINK WITH NON-UNIFORM FINS AND TRANSVERSE PROTRUSION

BACKGROUND OF THE INVENTION

1. Field of the Invention

The present invention relates to a heat sink, a cooling device for an electronic device and an electronic device.

2. Description of the Related Art

An electronic device such as a personal computer includes an electronic member such as an LSI, and the amount of heat produced by electronic members such as LSIs is increasing. On the other hand, the electronic device is required to become thinner and more compact. Therefore, an electronic device which is small in size and has a high cooling performance is required.

Various heat sinks are used to dissipate the heat produced by an electronic member such as an LSI. In addition, a cooling device including a fan and a heat sink can be used. For example, a heat sink has been proposed in which the surface of the base, which is the main body of the heat sink, is formed stepwise, with the surface being elevated higher toward the center (refer to Japanese Unexamined Patent Publication (Kokai) No. 11-40967, for example). Another heat sink has been proposed which has a plurality of fins provided in parallel to each other on the surface of a base, with the ends of the fins on the upstream side of the air flow being set back further toward the center (refer to Japanese Unexamined Patent Publication (Kokai) No. 10-209351, for example). A further heat sink has been proposed in which fins are provided on the top surface and the lower surface of a base (refer to Japanese Unexamined Patent Publication (Kokai) No. 2001-15969, for example). On the other hand, a cooling device has been proposed in which a fan is arranged above a heat sink (refer to Japanese Unexamined Patent Publication (Kokai) No. 2001-274575, for example). A further cooling device has been proposed in which a fan is arranged adjacent to a heat sink (refer to Japanese Unexamined Patent Publication (Kokai) No. 2002-64167, for example).

It is desirable to use a large heat sink (the base is wide, the base is thick, or the fins provided on the base are tall) in order to cool an LSI which produces a large amount of heat. However, the space for arranging a heat sink internally in an electronic device such as a notebook-type personal computer is very small. For example, in the case of a heat sink having fins, it is possible to increase the amount of heat to be dissipated by increasing the thickness of the base of the heat sink or the thickness of the fins, but the heat sink as a whole becomes taller. On the other hand, in the case of a cooling device in which a fan is provided above a heat sink, the cooling device as a whole becomes taller. If a configuration in which a fan is arranged adjacent to a heat sink (a fan and a heat sink are arranged side by side on the same plane) is adopted, the cooling device as a whole does not become very tall. In this case, it is preferable for the heat sink to be cooled efficiently by the air delivered by the fan.

The object of the present invention is to provide a small heat sink capable of cooling an electronic member efficiently, a cooling device for an electronic device and an electronic device.

SUMMARY OF THE INVENTION

According to an aspect of the present invention, a heat sink comprises a generally rectangular flat base and a plurality of fins provided on the surface of the base in parallel to each other, wherein the fins are configured shorter on one end side of the base.

A cooling device for an electronic device comprises the above recited heat sink with a fan arranged adjacent to the heat sink.

An electronic device comprises an electronic member, the above recited heat sink is made to come into contact with the electronic member, and a fan arranged adjacent to the heat sink.

In the heat sink, the cooling device for an electronic device and the electronic device configured as stated above, the air delivered by the fan flows almost evenly into the spaces between the fins of the heat sink and the heat sink can be cooled efficiently. Therefore, it is possible to efficiently dissipate the heat produced in the electronic member through the heat sink and efficiently cool the electronic member without increasing the height of the heat sink and the cooling device.

According to an aspect of the present invention, a heat sink comprises a generally rectangular flat base, a plurality of fins provided on the surface of the base in parallel to each other, and a protrusion provided on the surface of the base along the substantially overall width of the base in the transverse direction to the fins.

A cooling device for an electronic device comprises the above recited heat sink and a fan provided adjacent to the heat sink.

An electronic device comprises an electronic member, the above recited heat sink made to come into contact with the electronic member, and a fan provided adjacent to the heat sink.

In the heat sink, the cooling device for an electronic device and the electronic device configured as stated above, the heat produced by the electronic member is transmitted to the base of the heat sink, further transmitted from the base to the fins, and dissipated, from the fin, into the current of air discharged from the fan. In general, as the base of the heat sink is larger than the electronic member, the heat transmitted from the electronic member to the base is unlikely to reach the part of the base outside the electronic member. Therefore, by providing a protrusion across the substantially the overall width of the base, the heat is more likely to reach the part outside the electronic member of the base along the thickened part of the base including the protrusion, and the heat is transmitted to all of the fins therefrom and dissipated from the fins. If there is a limit to the height of the heat sink and the base as a whole is increased in thickness, it is necessary to reduce the height of the fins, but in this aspect, only a part of the base is increased in thickness and, therefore, it is not necessary to reduce the height of the fins and the surface area of the fins can be increased. Therefore, without increasing the height of the heat sink and the cooling device, it is possible to efficiently dissipate the heat produced by the electronic member and efficiently cool the electronic member.

According to an aspect of the present invention, a heat sink comprises a generally rectangular flat base, a plurality of fins provided on the surface of the base in parallel to each other, and a protrusion provided on the surface of the base opposite to that on which the plurality of fins are provided along the substantially overall width of the base in the transverse direction to the fins.

A cooling device for an electronic device comprises the above recited heat sink and a fan arranged adjacent to the heat sink.

An electronic device comprises an electronic member, the above recited heat sink made to come into contact with the electronic member, and a fan arranged adjacent to the heat sink.

In these configurations, similar to the case where the above-mentioned protrusion is provided on the surface of the base, it is possible to efficiently dissipate the heat produced in the electronic member and efficiently cool the electronic member without increasing the height of the heat sink and the cooling device. In addition, the protrusion functions as a spacer between the electronic member and the heat sink.

According to an aspect of the present invention, a heat sink comprises a generally rectangular flat base, a plurality of fins provided on the surface of the base in parallel to each other, a first protrusion provided on the surface of the base along the substantially overall width of the base in the transverse direction to the fins, and a second protrusion provided on the surface of the base opposite to that on which the fins are provided along the substantially overall width of the base in parallel to the first protrusion.

A cooling device for an electronic device comprises the above recited heat sink and a fan arranged adjacent to the heat sink.

An electronic device comprises an electronic member, the above recited heat sink made to come into contact with the electronic member, and a fan arranged adjacent to the heat sink.

In these configurations, similar to the case where the above-mentioned protrusion is provided on the surface of the base, it is possible to efficiently dissipate the heat produced by the electronic member and efficiently cool the electronic member without increasing the height of the heat sink and the cooling device. In addition, the second protrusion has a function as a spacer between the electronic member and the heat sink.

According to an aspect of the present invention, a heat sink comprises a generally rectangular flat base, a plurality of fins provided on the surface of the base in parallel to each other, and a protrusion provided on the surface of the base along the substantially overall width of the base in the transverse direction to the fins, wherein the fins are configured to be gradually shorter on one end side of the base.

A cooling device for an electronic device comprises the above recited heat sink and a fan arranged adjacent to the heat sink.

An electronic device comprises an electronic member, the above recited heat sink made to come into contact with the electronic member, and a fan arranged adjacent to the heat sink.

In the heat sink, the cooling device for an electronic device, and the electronic device configured as stated above, the air delivered by the fan flows almost evenly into the spaces between the fins of the heat sink and it is possible to efficiently cool the heat sink. On the other side, the heat produced in the electronic member is transmitted to the base of the heat sink, diffused along the protrusion of the base, further transmitted from the base to the fins, and dissipated from the fins. Therefore, it is possible to efficiently dissipate the heat produced in the electronic member and efficiently cool the electronic member without increasing the height of the heat sink and the cooling system.

According to an aspect of the present invention, a heat sink comprises a generally rectangular flat base, a plurality of fins provided on the surface of the base in parallel to each other, a protrusion provided on the surface of the base along the substantially overall width of the base in the transverse direction to the fins, and a cover for covering the fins, wherein the cover has a flap extending in parallel to the protrusion in order to guide a current of air toward the protrusion.

A cooling device for an electronic device comprises the above recited heat sink and a fan arranged adjacent to the heat sink.

An electronic device comprises an electronic member, the above recited heat sink made to come into contact with the electronic member, and a fan arranged adjacent to the heat sink.

In the heat sink, the cooling device for an electronic device, and the electronic device configured as stated above, the heat produced by the electronic member is transmitted to the base of the heat sink, diffused along the protrusion of the base, further transmitted from the base to the fins, and dissipated from the fins. As the cover is provided so as to cover the fins, the air sent from the fan passes almost evenly through the spaces between the fins of the heat sink and it is possible to efficiently cool the heat sink. Moreover, as the cover has the flap extending in parallel to the protrusion, a current of relatively cool air flowing along the cover far from the base of the heat sink is guided toward the protrusion at a high temperature and the cooling performance of the heat sink can be improved further.

DESCRIPTION OF PREFERRED EMBODIMENTS

The embodiments of the present invention are described below with reference to the drawings.

Figure 6:
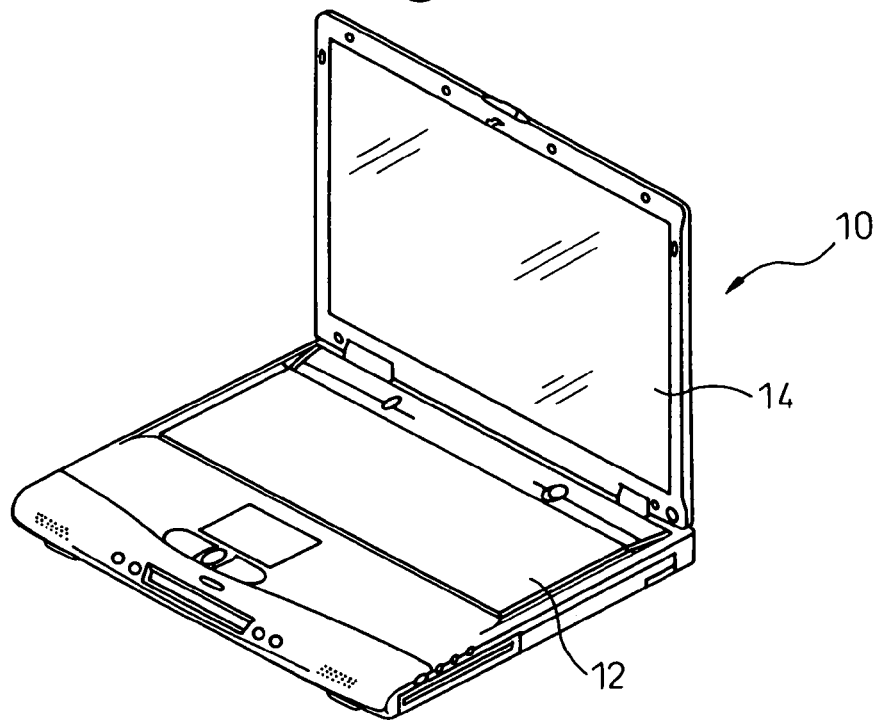
FIG. 6 is a perspective view showing an electronic device relating to the present invention.
Figure 7:
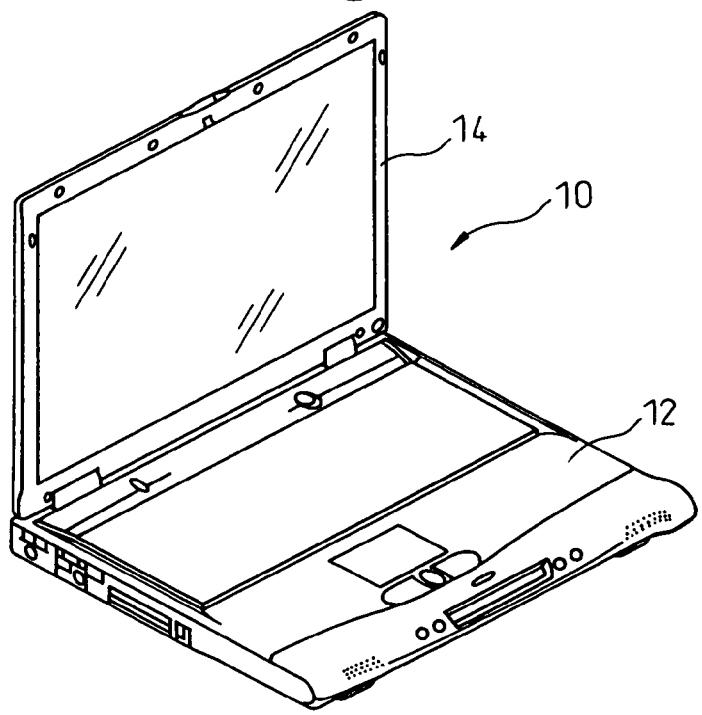
FIG. 7 is a perspective view showing the electronic device in FIG. 6 seen from the opposite direction.

FIG. 6 is a perspective view showing an electronic device relating to the present invention. FIG. 7 is a perspective view showing the electronic device in FIG. 6 from the opposite direction. Although a notebook-type personal computer is shown as an example of an electronic device 10, the electronic device 10 of the present invention is not limited to a notebook-type personal computer.

Figure 2:
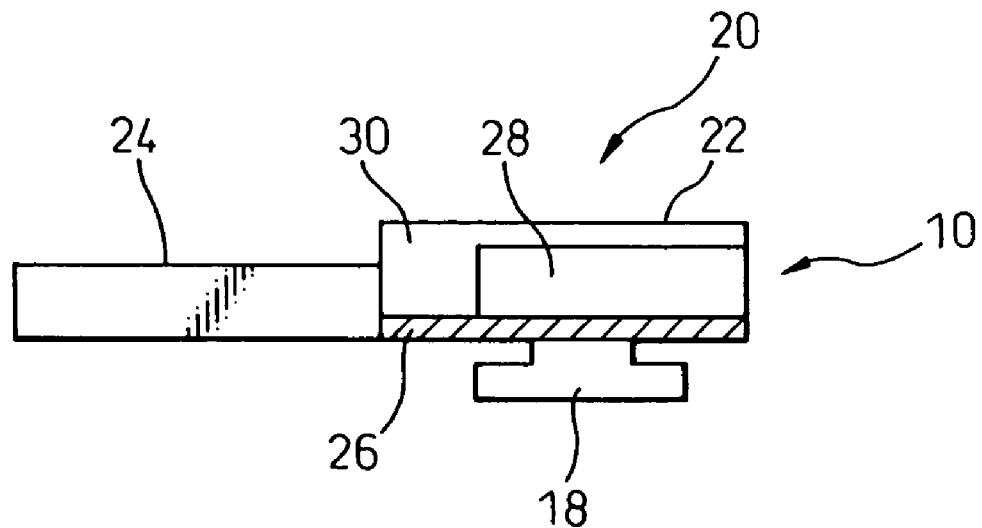
FIG. 2 is a schematic sectional view showing the electronic device in FIG. 1.
Figure 3:
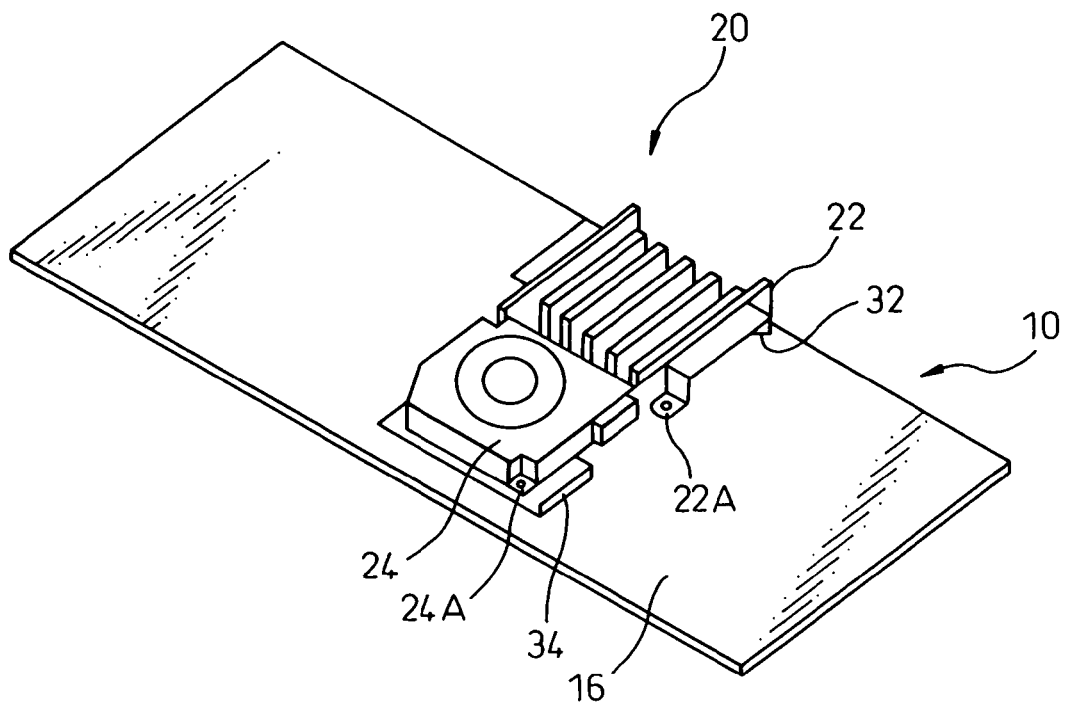
FIG. 3 is a perspective view of the electronic device in FIG. 1, including a circuit substrate.
Figure 4:
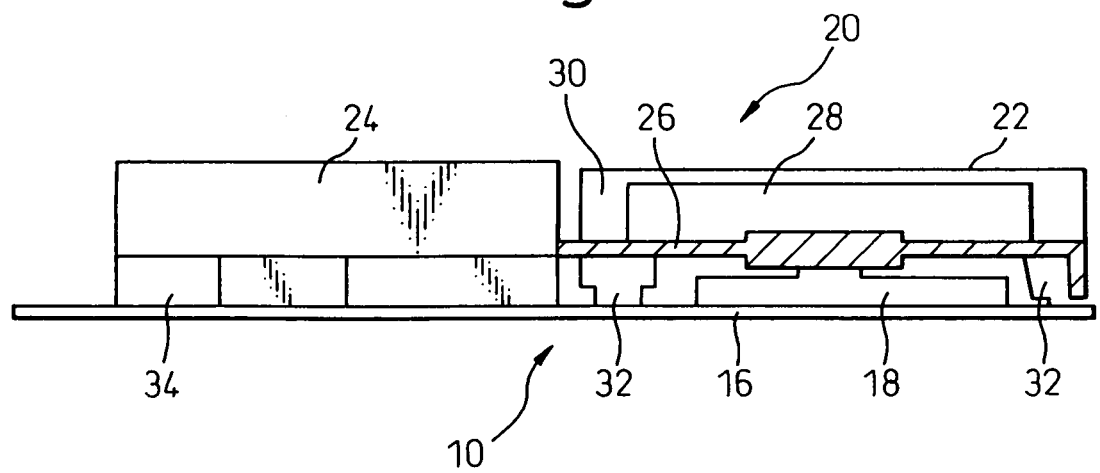
FIG. 4 is a sectional view showing the electronic device in FIG. 3.
Figure 5:
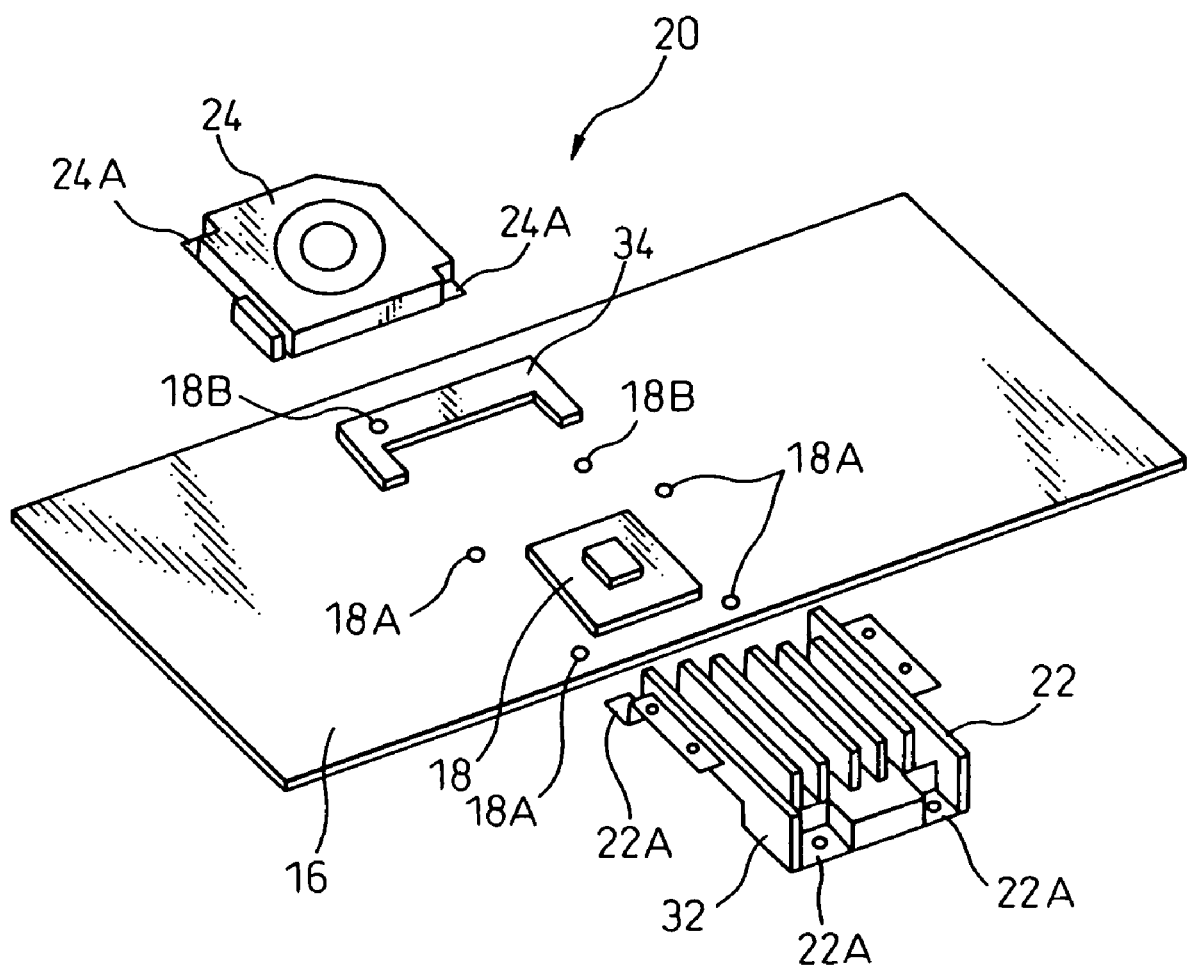
FIG. 5 is an exploded perspective view showing the electronic device in FIG. 3.

The electronic device 10 comprises a main body 12 and a display 14 pivotally attached to the main body 12. The main body 12 has a casing, and a keyboard and other input/output devices are arranged on the top and sides of the casing. Within the casing of the main body 12, electric members, electronic members and circuit substrates are arranged. Moreover, a cooling device for cooling the electronic members which produce heat is arranged within the casing. As an example, a circuit substrate 16, an electronic member 18 and a cooling device 20 are shown in FIGS. 3 to 5. The electronic member 18 is an LSI which produces heat. FIGS. 1 and 2 and FIGS. 8 to 21 show the electronic member 18 and the cooling device 20 arranged within the casing of the electronic device 10.

Figure 1:
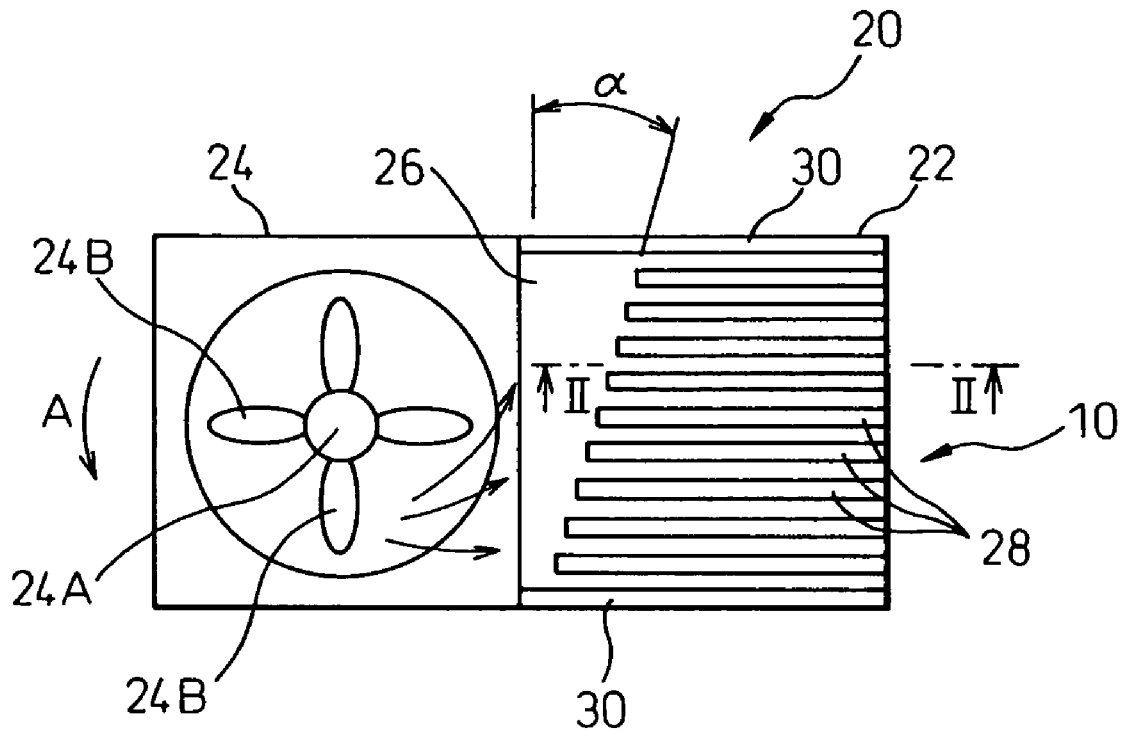
FIG. 1 is a top plan view showing an electronic device of an embodiment of the present invention.

FIG. 1 is a top plan view of an electronic device of an embodiment of the present invention. FIG. 2 is a schematic sectional view showing the electronic device in FIG. 1 along the line II-II in FIG. 1. In FIGS. 1 and 2, the electronic device 10 includes the electronic member 18 and the cooling device 20. The cooling device 20 includes a heat sink 22 and a fan 24 arranged adjacent to the heat sink 22. The fan 24 and the heat sink 22 are almost equal in width and thickness and, as they are arranged side by side on the same plane, the cooling device 20 as a whole is not very tall.

The heat sink 22 comprises a generally rectangular flat base 26, a plurality of long fins 28 provided on the surface of the base 26 in parallel to each other, and a pair of guide walls 30 provided on the surface of the base 26 on both sides thereof in parallel to the fins 28. The fins 28 are straight and arranged so as to be parallel to a current of air delivered by the fan 24. The heat sink 22 is arranged so that the surface of the base 26, opposite to the surface on which the fins 28 are arranged, comes into contact with the electronic member 18.

The fins 28 are configured gradually shorter on one end side of the base 26, that is, on the side of one end of the base 26 near the fan 24. In other words, the ends of the fins 28 are arranged on a line extending oblique to a line perpendicular to the fin 28. The angle between the line perpendicular to the fins 28 and the line extending obliquely to the fins 28 is denoted by α. In FIG. 1, the ends of the guide walls 30 extend to one end side of the base 26. The fins 28 are arranged so that the distance between the ends of the fins 28 and one end of the base 26 gradually increases.

The fan 24 has a rotary shaft 24A and blades 24B attached to the rotary shaft 24A, and the rotary shaft 24A is arranged perpendicular to the base 26 of the heat sink 22. The fan 24 is a centrifugal fan which takes in air in the axial direction and discharges it in the radial direction. The rotation direction of the fan 24 is denoted by the arrow A. As shown in FIG. 1, the air is discharged from the fan 24 according to the rotation direction A of the fan 24. The flow of discharged air is shown by arrows. If the fan 24 is arranged at a position far from the heat sink 22, the current of air reaching the heat sink 24 from the fan 24 can be regarded as an almost uniform flow, but if the fan 24 is arranged adjacent to (in the vicinity of) the heat sink 22, the current of air reaching the heat sink 22 from the fan 24 is affected by the air locally discharged from the fan 24.

In the examples shown in FIGS. 1 and 2, there is a tendency for the air from the fan 24 to flow into the spaces between the fins 28 positioned near the side from which the air is discharged (lower side in FIG. 1), therefore, the ends of the fins 28 are arranged nearer the fan 24. The air from the fan 24 is unlikely to flow into the spaces between the fins 28 positioned far from the side from which air is discharged (upper side in FIG. 1), therefore, the ends of the fins 28 are arranged far from the fan 24 so that a path for a sufficient amount of air can be provided. Therefore, the air discharged from the fan 24 flows almost uniformly into every space between the fins 28 and the heat sink 22 can be cooled efficiently. Due to this, it is possible to efficiently dissipate the heat produced by the electronic member 18 through the heat sink 22 and efficiently cool the electronic member 18 without increasing the height of the heat sink 22 and the cooling device 20, that is, without increasing the height of the electronic device 10.

In this way, in the case where the current of air produced by the fan 24 is not uniform but is discharged in an oblique direction, a rectification effect can be obtained by arranging the fins 28 so that the ends of the fins 28 on an obliquely line, viewed from the top surface of the heat sink 22, in order to guide the air uniformly into the spaces between the fins 28. Moreover, because the speed at which the air flows into the spaces between the fins 28 can be maintained, it is possible to evenly deliver the air to the heat sink 22 which covers the electronic member 18. Due to this, a high cooling performance can be realized while space can be saved.

Figure 8:
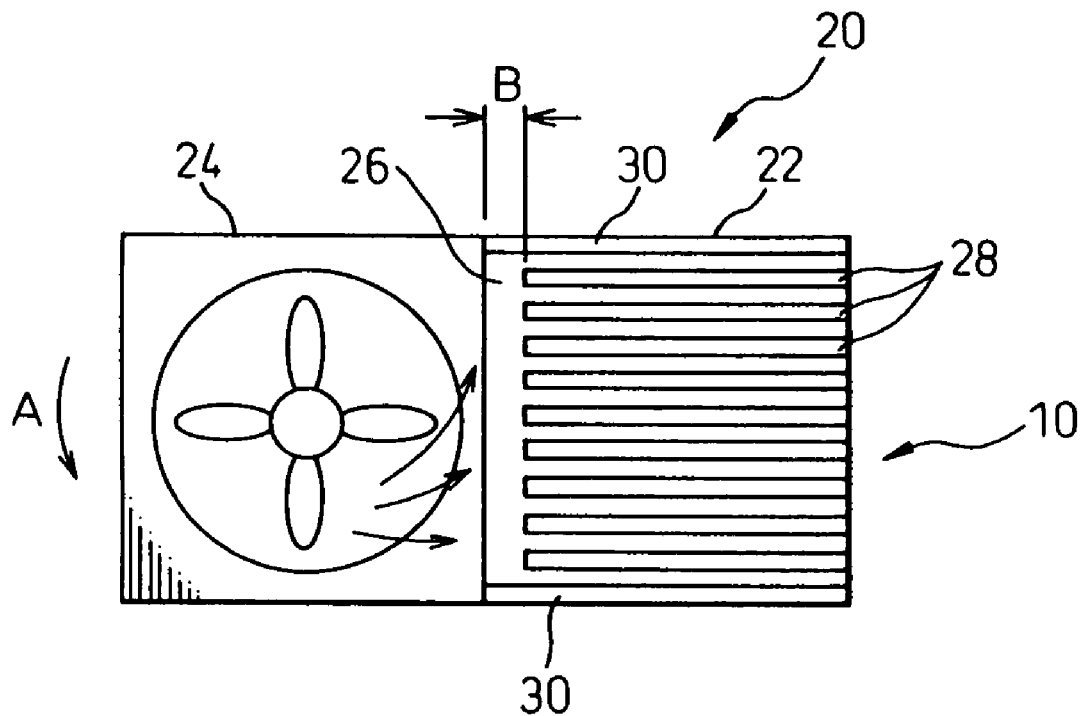
FIG. 8 is a top plan view showing an example of a cooling system.
Figure 9:
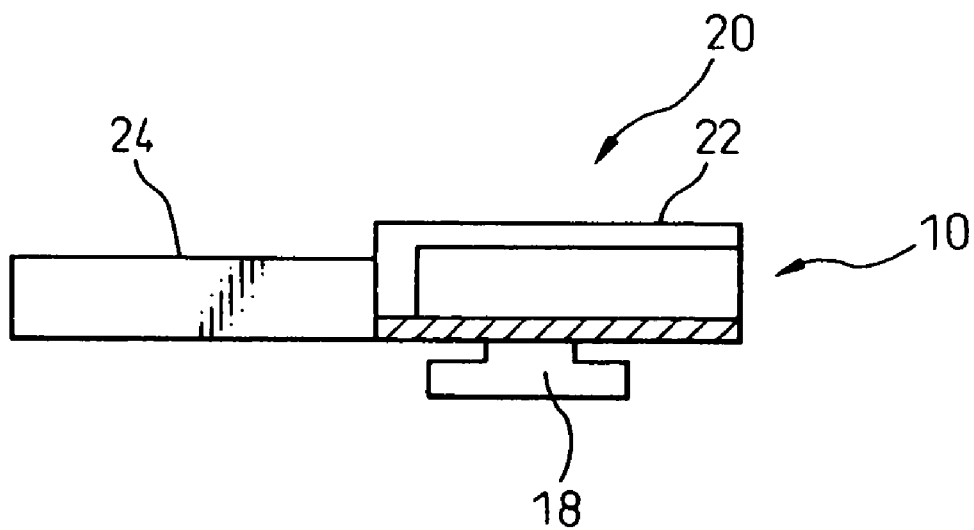
FIG. 9 is a schematic sectional view showing the cooling system in FIG. 8.

FIG. 8 is a top plan view showing an example of a cooling device. FIG. 9 is a schematic section view showing the cooling device in FIG. 8. In this example, all of the fins 28 have the same length. In this case, there is a tendency for the air to easily flow into the spaces between the fins 28 positioned near the side from which the air is discharged but the air does not easily flow into the spaces between the fins 28 positioned far from the side from which the air is discharged. Therefore, the air discharged from the fan 24 does not uniformly flow into spaces between the fins 28 of the heat sink 22 and it is necessary to increase the distance B between the end of the base 26 the heat sink 22 and the ends of the fins 28.

FIG. 3 is a perspective view showing the electronic device 10 in FIG. 1 including the circuit substrate 16. FIG. 4 is a sectional view showing the electronic device 10 in FIG. 3. FIG. 5 is an exploded perspective view showing the electronic device 10 in FIG. 3. The fan 24 is mounted adjacent to the heat sink 22 on the circuit substrate 16. The electronic member 18 is attached to the circuit substrate 16. The circuit substrate 16 has holes 18A around the electronic member 18 and the heat sink 22 has fixing parts 22A with holes. The heat sink 22 is fixed to the circuit substrate 16 by using screws (not shown) through the holes of the fixing parts 22A and the holes 18A. In addition, the circuit substrate 16 has holes 18B near the electronic member 18 and the fan 24 has fixing parts 24A with holes. The fan 24 is fixed to the circuit substrate 16 by using screws (not shown) through the holes of the fixing parts 24A and the holes 18B.

The heat sink 22 has legs 32 extending downward from the base 26. The legs 32 come into contact with the circuit substrate 16 and the heat sink 22 is fixed to the circuit substrate 16 in a state in which the base 26 is apart from the circuit substrate 16. The electronic member 18 is arranged between the circuit substrate 16 and the base 26. The circuit substrate 16 has a supporting member 34 and the fan 24 is fixed to the circuit substrate 16 via the supporting member 34. Therefore, the fan 24 is arranged so that the height is almost the same as that of the heat sink 22.

Figure 10:
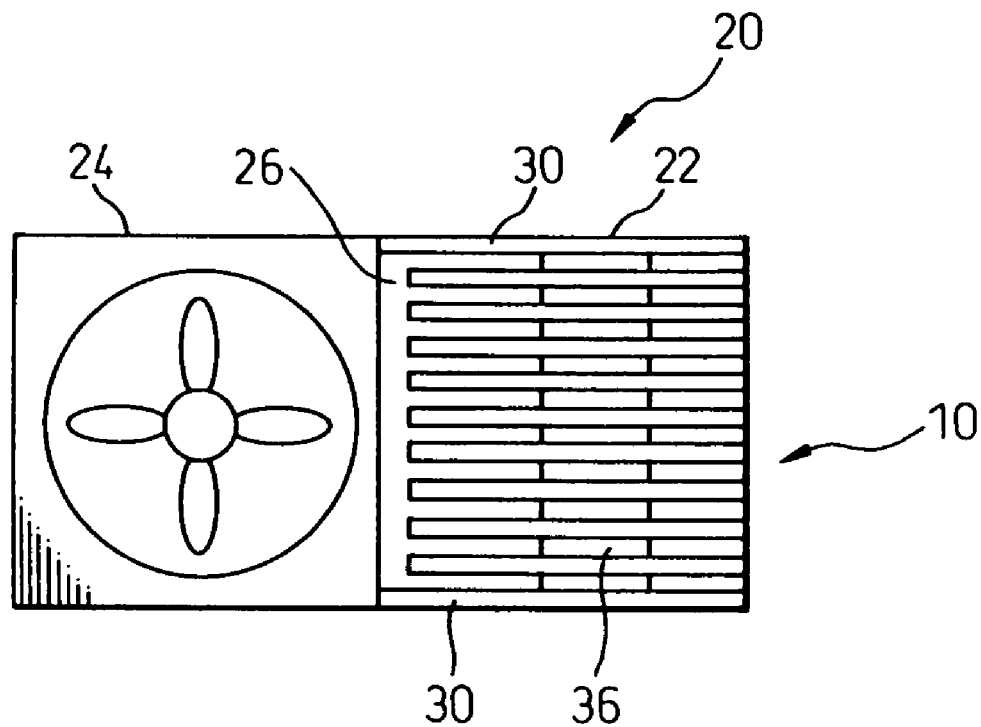
FIG. 10 is a top plan view showing an electronic device of an embodiment of the present invention.
Figure 11:
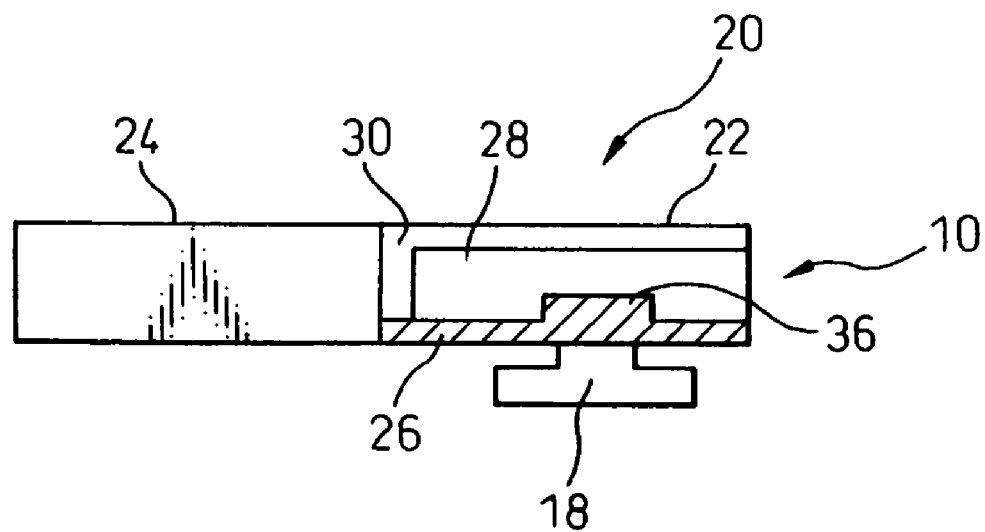
FIG. 11 is a schematic sectional view showing the electronic device in FIG. 10.

FIG. 10 is a top plan view showing an electronic device of another embodiment of the present invention. FIG. 11 is a schematic sectional view showing the electronic device in FIG. 10. In FIGS. 10 and 11, the cooling device 20 of the electronic device includes the heat sink 22 and the fan 24 arranged adjacent to the heat sink 22. The heat sink 22 comprises the generally rectangular flat base 26, a plurality of fins 28 provided in parallel to each other on the surface of the base 26, and a pair of guide walls 30 provided in parallel to the fins 28 on the surface of the base 26 on both sides thereof. The heat sink 22 is arranged so that the surface of the base 26 opposite to that on which the fins 28 are provided comes into contact with the electronic member 18.

Moreover, the heat sink 22 comprises a protrusion (rib) 36 provided across substantially the overall width of the base 26 in the transverse direction to the fins 28 on the surface of the base 26. In particular, the protrusion 36 is arranged at a position corresponding to the electronic member 18 and extends from one of the pair of guide walls 30 to the other in the direction perpendicular to the fins 28. The width of protrusion 36 is made equal to or slightly larger than the width of a chip of the electronic member 18. This feature can be applied to the electronic device 10 shown in FIGS. 3 to 7.

The heat produced by the electronic member 18 is transmitted to the base 26 of the heat sink 22, further transmitted from the base 26 to the fins 28, and dissipated from the fins 28 by the current of air discharged from the fan 24. In general, as the base 26 of the heat sink 22 is larger than the electronic member 18, the heat transmitted from the electronic member 18 to the base 26 is transmitted to an almost circular part of the base 26 about the center of the electronic member 18, and it is unlikely that the heat is transmitted to the part outside the electronic member 18. Therefore, by providing the protrusion 36 along the substantially overall width of the base 26, the heat can be diffused and transmitted along the thickened part of the base 26 including the protrusion 36, it is more likely that the heat is transmitted to the part outside the electronic member 18 of the base 26, and the heat is transmitted to all of the fins 28 therefrom and dissipated by the fins 28. If there is a limit to the height of the heat sink 22 and the thickness of the base 26 as a whole is increased, it will be required to reduce the height of the fins 28 provided on the surface of the base 26 but, in this example, the thickness of only a part of the base 26 is increased, therefore, it is not required to reduce the height of the fin 28 and the surface area of the fins 28 can be increased. Because of this, it is possible to efficiently dissipate the heat produced by the electronic member 18 through the heat sink 22 and efficiently cool the electronic member 18 without increasing the height of the heat sink 22 and cooling system 20.

In this way, if the thickness of the whole base 26 is increased, the cooling performance can be enhanced but, in order to solve the problem that the height of the fins 28 is reduced because of the limit to the size, the protrusion 36 extending in the transverse direction is provided on the base 26, the effect of heat diffusion in the transverse direction, which is equivalent to an effect obtained when the thickness of the base 26 is increased, is provided and, thereby, a larger amount of heat can be dissipated from the fins 28 positioned near the side of the base 26. The heat is diffused by the current of air in the longitudinal direction of the heat sink 22.

Figure 12:
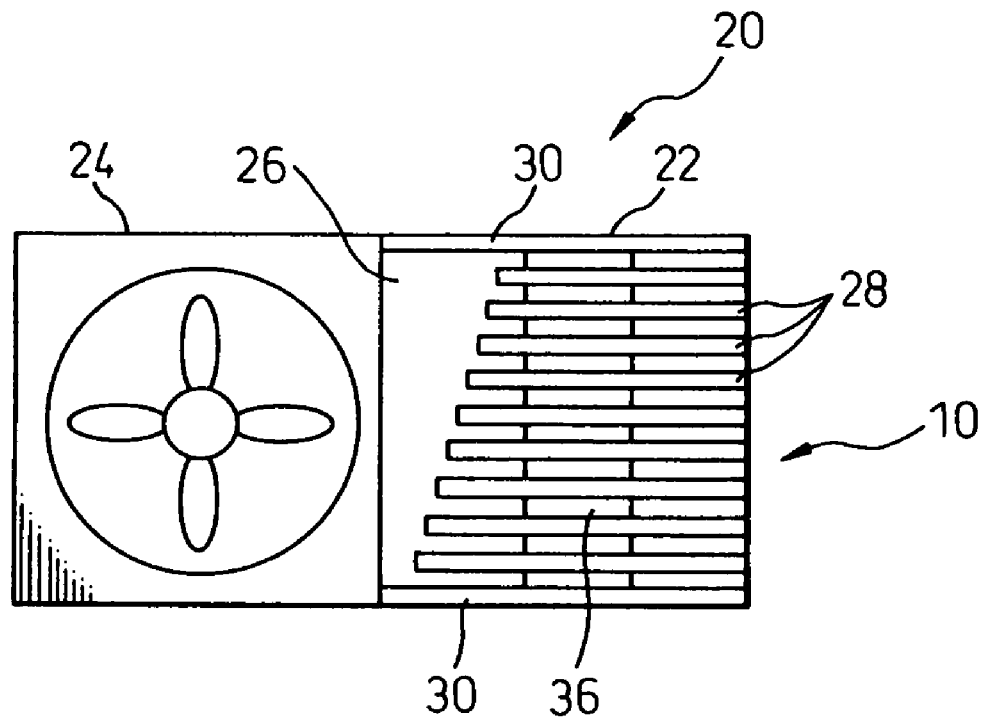
FIG. 12 is a top plan view showing an electronic device of an embodiment of the present invention.
Figure 13:
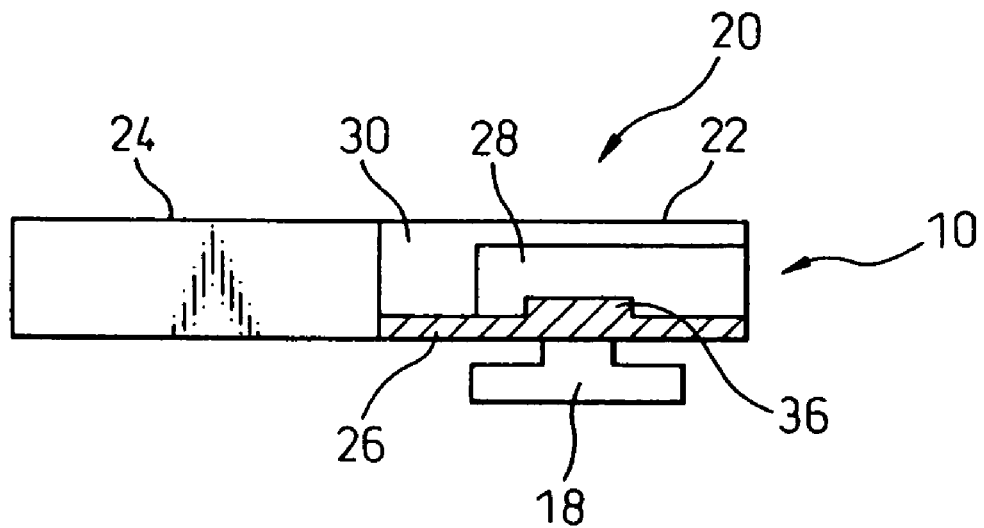
FIG. 13 is a schematic sectional view showing the electronic device in FIG. 12.

FIG. 12 is a top plan view of an electronic device of a further embodiment of the present invention. FIG. 13 is a schematic sectional view showing the electronic device shown in FIG. 12. In FIGS. 12 and 13, the cooling device 20 for the electronic device includes the heat sink 22 and the fan 24 arranged adjacent to the heat sink 22. The heat sink 22 comprises the generally rectangular flat base 26, a plurality of fins 28 provided in parallel to each other on the surface of the base 26, and a pair of guide walls 30 provided in parallel to the plurality of fins 28 on both sides thereof on the surface of the base 26.

As described above with reference to FIGS. 1 and 2, the ends of the fins 28 on the base 26 near the fan 24 are configured gradually smaller. In other words, the plurality of fins 28 are arranged so that the ends of the fins 28 form an oblique line with respect to a line perpendicular to the fins 28. The plurality of fins 28 are arranged so that the distance between the ends of the fins 28 and one end of the base 26 increases by a small amount toward one side of the base.

Moreover, the heat sink 22 comprises the protrusion (rib) 36 provided along the substantially overall width of the base 26 in the transverse direction to the fins 28 on the surface of the base 26 on which the fins 28 are provided. In this example, therefore, the air discharged from the fan 24 flows uniformly through the spaces between the fins 28, the heat produced by the electronic member 18 is diffused in the transverse direction by the protrusion 36, and the electronic member 18 is efficiently cooled through the heat sink 22. The protrusion 36 comes into contact directly with the electronic member 18.

Figure 14:
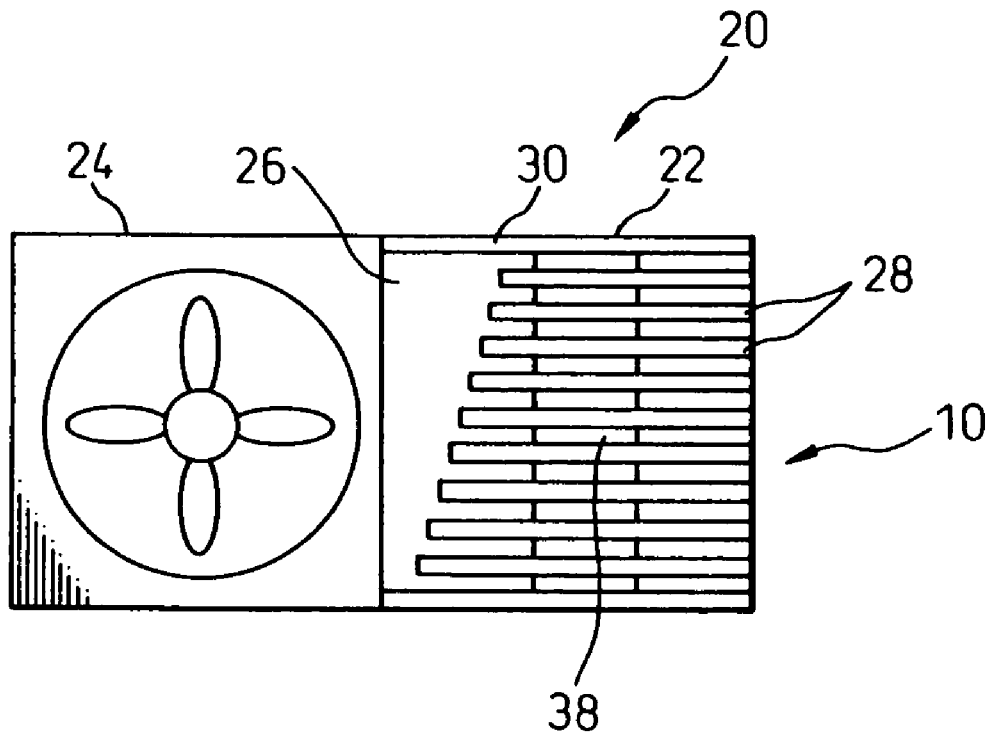
FIG. 14 is a top plan view showing an electronic device of an embodiment of the present invention.
Figure 15:
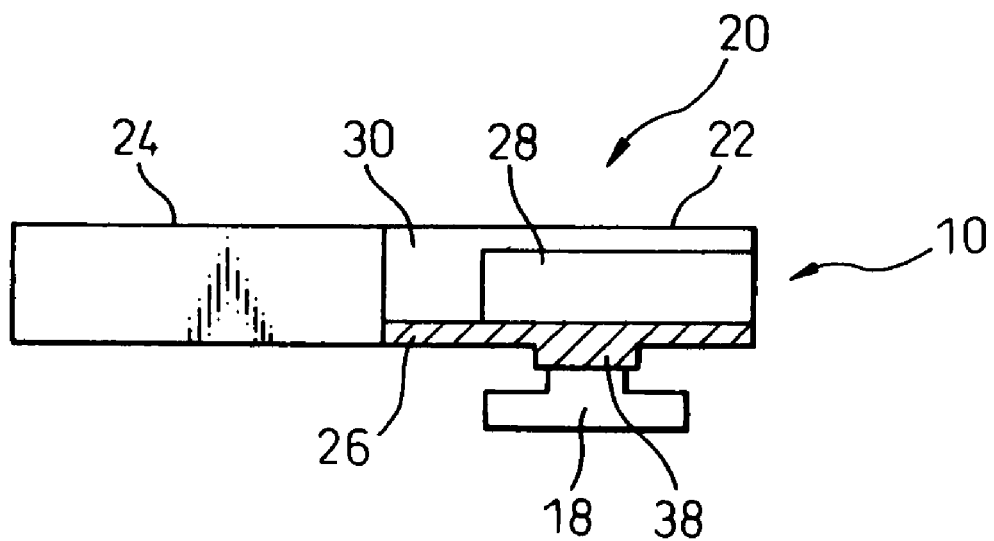
FIG. 15 is a schematic sectional view showing the electronic device in FIG. 14.

FIG. 14 is a top plan view showing an electronic device of a further embodiment of the present invention. FIG. 15 is a schematic sectional view showing the electronic device shown in FIG. 14. In FIGS. 14 and 15, the cooling device 20 for the electronic device includes the heat sink 22 and the fan 24 arranged adjacent to the heat sink 22. The heat sink 22 comprises the generally rectangular flat base 26, the plurality of fins 28 provided in parallel to each other on the surface of the base 26, and the pair of guide walls 30 provided in parallel to the plurality of fins 28 on both sides thereof on the surface of the base 26.

As described above with reference to FIGS. 1 and 2, the ends the fins 28 on one end side of the base 26 near the fan 24 are configured gradually shorter toward one side of the base. In other words, the fins 28 are arranged so that the ends of the fins 28 form an oblique line with respect to a line perpendicular to the fin 28. The plurality of fins 28 are arranged so that the distance between one ends of the fins 28 and one end of the base 26 increases by a small amount in order toward one side of the base.

Moreover, the heat sink 22 comprises a protrusion (rib) 38 provided along the substantially overall width of the base 26 in the transverse direction to the fins 28 on the surface of the base 26 opposite to that on which the fins 28 are provided. In other words, while the protrusion 36 shown in FIGS. 12 and 13 is provided on the top surface of the base 26 but, in the example shown in FIGS. 14 and 15, the protrusion 38 is provided on the lower surface of the base 26. The protrusion 38 has the same effect of heat diffusion in the transverse direction as the protrusion 36. The protrusion 38 comes in contact directly with the electronic member 18.

Figure 16:
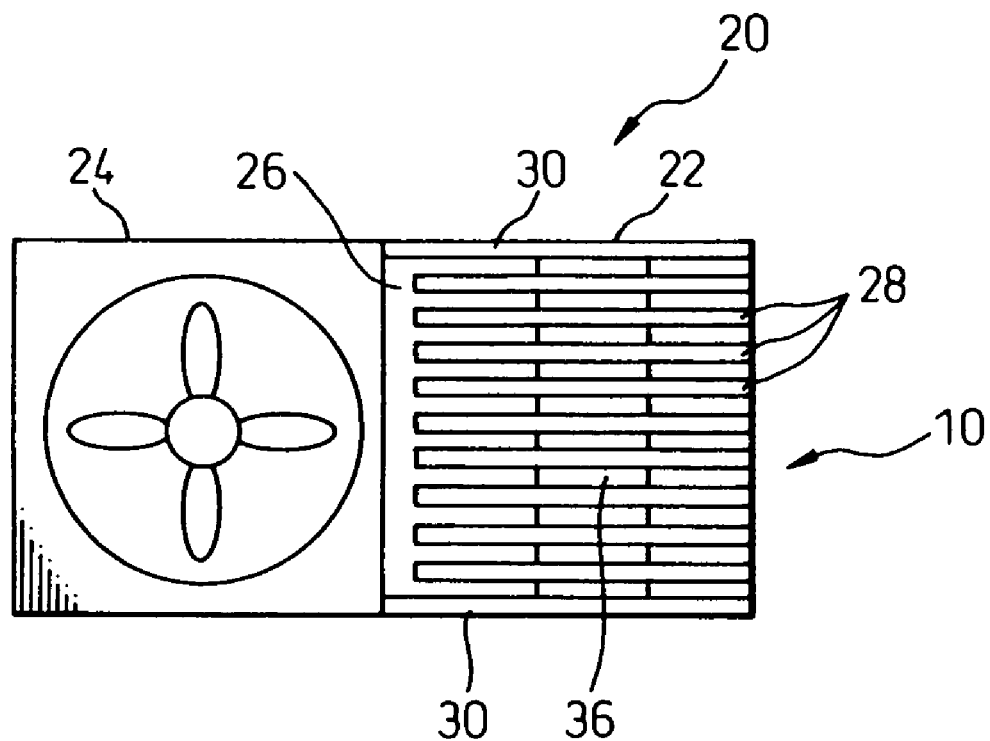
FIG. 16 is a top plan view showing an electronic device of an embodiment of the present invention.
Figure 17:
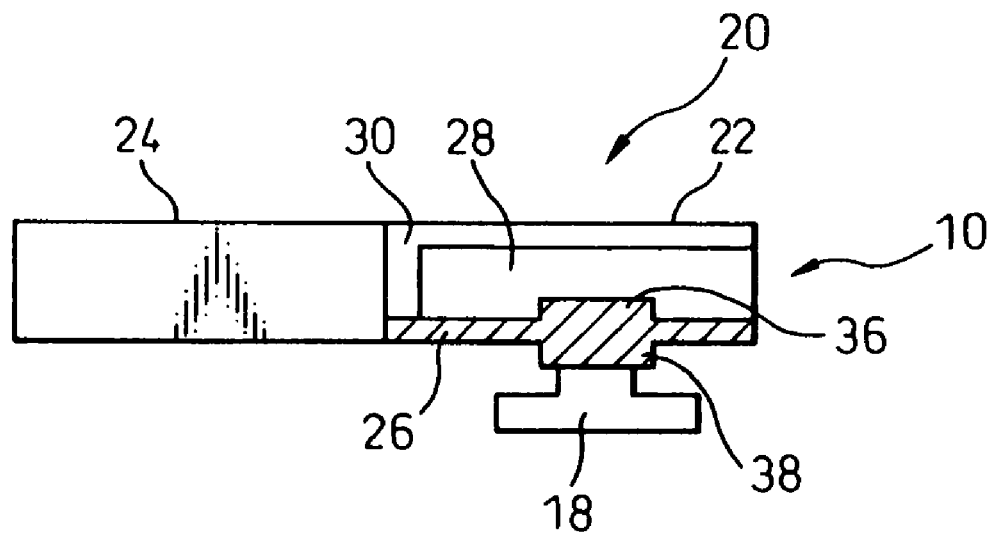
FIG. 17 is a schematic sectional view showing the electronic device in FIG. 16.

FIG. 16 is a top plan view showing an electronic device of a further embodiment of the present invention. FIG. 17 is a schematic sectional view showing the electronic device shown in FIG. 16. In FIGS. 16 and 17, the cooling device 20 for the electronic device includes the heat sink 22 and the fan 24 arranged adjacent to the heat sink 22. The heat sink comprises the generally rectangular flat base 26, the plurality of fins 28 provided in parallel to each other on the surface of the base 26, and the pair of guide walls 30 provided in parallel to the plurality of fins 28 on the surface of the base 26 on both sides thereof.

Moreover, the heat sink 22 comprises the protrusion (rib) 36 provided along the substantially overall width of the base 26 in the transverse direction to the fins 28 on the surface of the base 26 and the protrusion (rib) 38 provided along the substantially overall width of the base 26 in the transverse direction to the fins 28 on the surface of the base 26 opposite to that on which the plurality of fins 28 are provided. In other words, the example shown in FIGS. 16 and 17 includes the protrusion 36 on the top surface and the protrusion 38 on the lower surface of the base 26. The protrusion 36 and the protrusion 38 have the same effect of heat diffusion in the transverse direction as that in the previous example.

Figure 18:
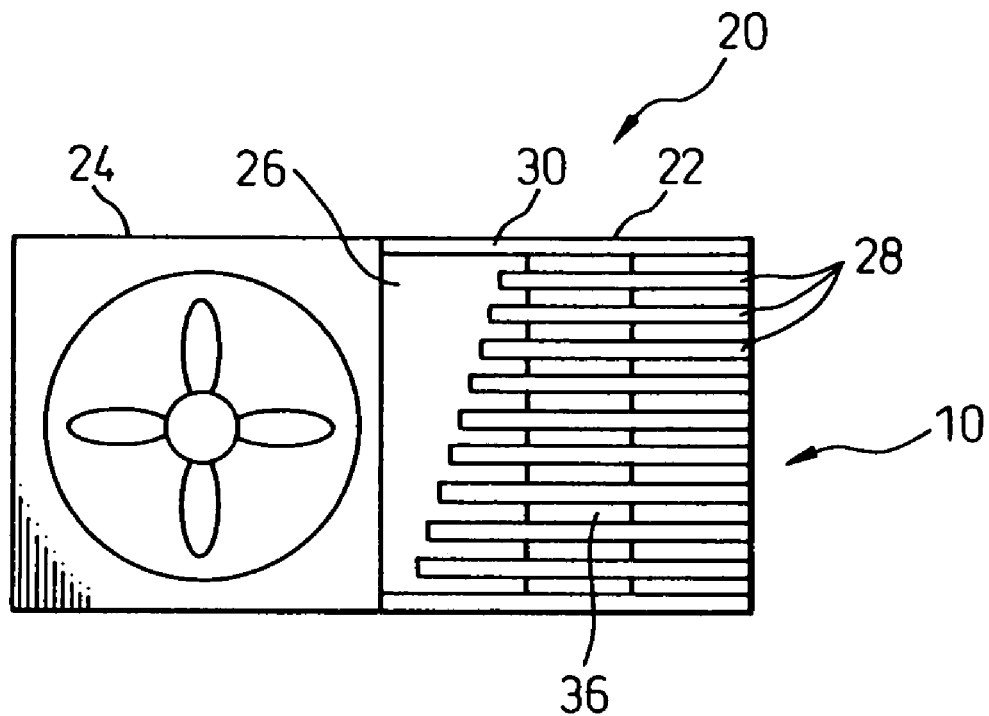
FIG. 18 is a top plan view showing an electronic device of an embodiment of the present invention.
Figure 19:
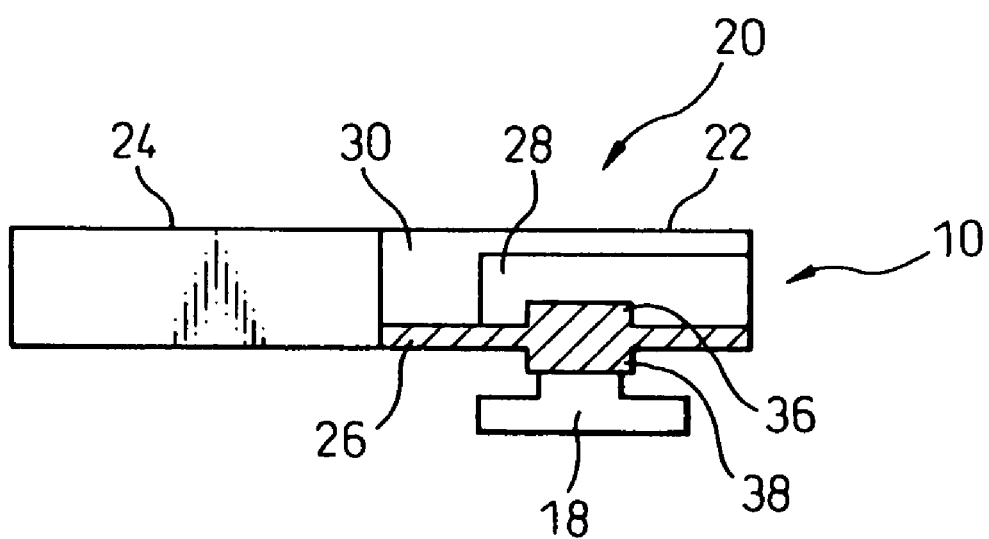
FIG. 19 is a schematic sectional view showing the electronic device in FIG. 18.

FIG. 18 is a top plan view showing an electronic device of a further embodiment of the present invention. FIG. 19 is a schematic sectional view showing the electronic device shown in FIG. 18. In FIGS. 18 and 19, the cooling device 20 for the electronic device includes the heat sink 22 and the fan 24 provided adjacent to the heat sink 22. The heat sink 22 comprises the generally rectangular flat base 26, the plurality of fins 28 provided in parallel to each other on the surface of the base 26, and the pair of guide walls 30 provided in parallel to the plurality of fins 28 on the surface of the base 26 on both sides thereof.

As described above with reference to FIGS. 1 and 2, the ends of the fins 28 on the side of the base 26 near the fan 24 are configured gradually shorter toward one side of the base. In other words, the plurality of fins 28 are arranged so that the ends of the fins 28 form an oblique line with respect to a line perpendicular to the fins 28. The plurality of fins 28 are arranged so that the distance between the ends of the fins 28 and the end of the base 26 increases by a small amount toward one side of the base.

Moreover, the heat sink comprises the protrusion (rib) 36 provided along the substantially overall width of the base 26 in the transverse direction to the fins 28 on the surface of the base 26 and the protrusion (rib) 38 provided along substantially the overall width of the base 26 on the surface opposite to that on which the plurality of fins 28 are provided. This example, therefore, has the effect of the uniform current of air due to the oblique arrangement of the ends of the fins 28 and at the same time has the effect of heat diffusion in the transverse direction due to the protrusion 36 and the protrusion 38 extending in the transverse direction of the base 26.

Figure 20:
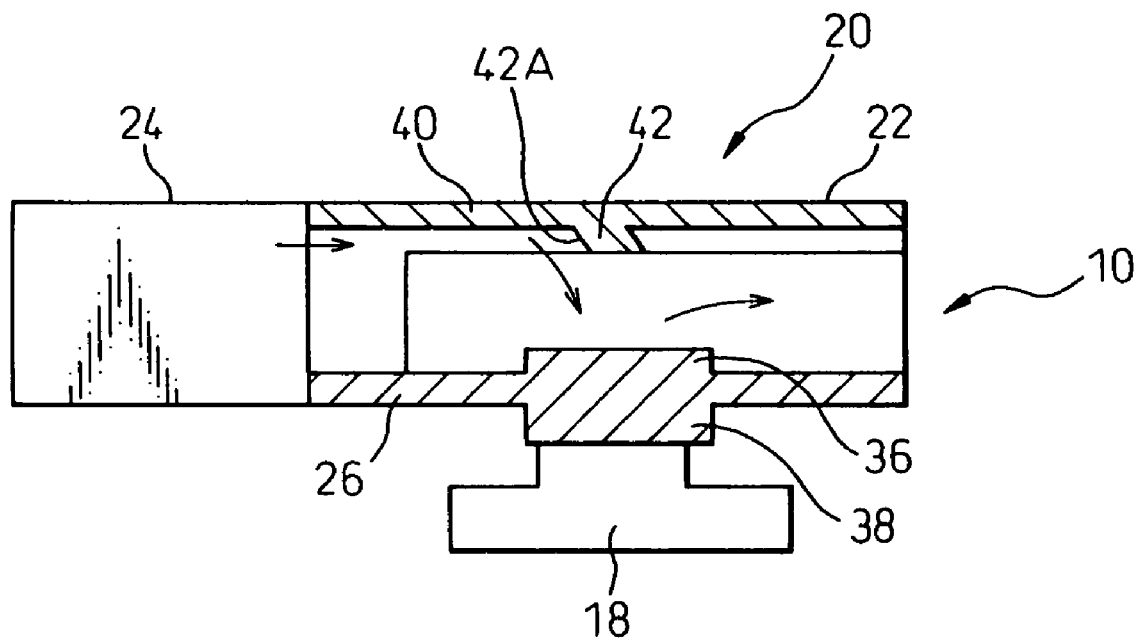
FIG. 20 is a top plan view showing an electronic device of an embodiment of the present invention.
Figure 21:
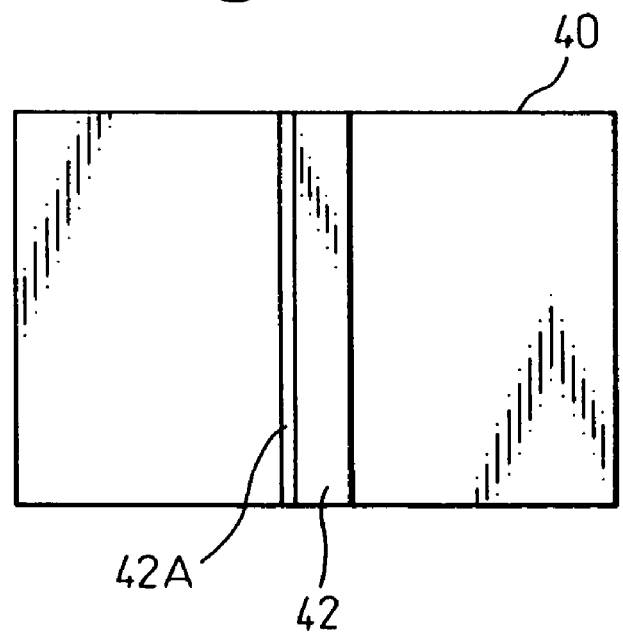
FIG. 21 is a view showing the inner surface of a cover of the electronic device cooling system in FIG. 20.

FIG. 20 is a top plan view showing an electronic device of a further embodiment of the present invention. FIG. 21 is a diagram showing the inner surface of the cover of the cooling device for the electronic device in FIG. 20. In FIGS. 20 and 21, the cooling device 20 for the electronic device includes the heat sink 22 and the fan 24 arranged adjacent to the heat sink 22. The heat sink 22 comprises the generally rectangular flat base 26, the plurality of fins 28 provided in parallel to each other on the surface of the base 26, and the pair of guide walls 30 provided in parallel to the plurality of fins 28 on the surface of the base 26 on both sides thereof.

As described above with reference to FIGS. 1 and 2, the ends of the fins 28 on the base 26 near the fan 24 are configured gradually shorter in order toward one side of the base. On the other hand, all of the fins 28 can have the same length as described above with reference to FIGS. 8 and 9. Moreover, as described above with reference to FIGS. 16 and 17, the heat sink 22 can comprise the protrusion (rib) 36 provided along the substantially overall width of the base 26 in the transverse direction to the fins 28 on the surface of the base 26 and the protrusion (rib) 38 provided along the substantially overall width of the base 26 in the transverse direction to the fins 28 on the surface of the base 26 opposite to that on which the fins 28 are provided. However, it is possible to arrange that the heat sink has only the protrusion 36.

In FIGS. 20 and 21, the heat sink 22 comprises a cover 40 for covering the fins 28. The cover has a flap 42 extending in parallel to the protrusion 36 in order to guide a current of air toward the protrusion 36. The flap 42 extends from one of the pair of guide walls 30 to the other. The flap 42 has an inclined surface 42A at a position corresponding to the protrusion 36 or at a position on the upstream side of the protrusion 36 in the direction of the current of air when in use. The inclined surface 42 is inclined toward the protrusion 36. This feature can be applied to the electronic device in FIGS. 3 to 7. Moreover, the cover 40 can be part of the casing of the electronic device 10.

In the heat sink 22, the cooling device 20 for the electronic device and the electronic device 10 configured as stated above, the heat produced by the electronic member 18 is transmitted to the base 26 of the heat sink 22, diffused along the protrusion 36 of the base 26 in the transverse direction, transmitted from the base 26 to the fins 28, and dissipated from the fins 28. As the cover 40 is provided so as to cover the fins 28, the air delivered from the fan 24 passes almost uniformly through the spaces between the fins 28 of the heat sink 22 and the heat sink 22 can be cooled efficiently. Moreover, as the cover 40 has the flap 42 extending in parallel to the protrusion 36, the relatively cool air flowing along the cover 40 far from the base 26 of the heat sink 22 is concentratedly guided toward the protrusion which is at a high temperature, therefore, the cooling performance of the heat sink 22 can be improved further.

According to the present invention, as described above, it is possible to obtain a small heat sink, a cooling device for an electronic device and an electronic device capable of cooling an electronic member efficiently.

The invention claimed is:

1. A heat sink comprising:
   a generally rectangular flat base;
   a plurality of fins provided on a surface of the base in parallel to each other; and
   a pair of guide walls provided on the surface of the base on both sides thereof in parallel to the fins,
   wherein the pair of guide walls extends beyond the fins on one end side of the base, and
   wherein the fins are configured shorter on one end side of the base, configured longer on the other side of the base at an upstream side of an airflow from a fan, and arranged so that the ends of the fins facing the fan form a linear oblique line, from the longer fins to the shorter fins, with respect to a line perpendicular to the fins.

2. A cooling device for an electronic device comprising:
   a heat sink; and
   a fan arranged adjacent to the heat sink,
   wherein the heat sink comprises:
   a generally rectangular flat base;
   and a plurality of fins which are arranged in parallel to each other, configured shorter on one side of the flat base, configured longer on the other side of the flat base at an upstream side of an airflow from a fan, and arranged so that the ends of the fins facing the fan form a linear oblique line, from the longer fins to the shorter fins, with respect to a line perpendicular to the fins.

3. An electronic device comprising:
   an electronic member;
   a heat sink made to come into contact with the electronic member; and a fan arranged adjacent to the heat sink, wherein the heat sink comprises:

a generally rectangular flat base; and a plurality of fins which are arranged in parallel to each other, configured shorter on one side of the flat base, configured longer on the other side of the flat base at an upstream side of an airflow from a fan, and arranged so that the ends of the fins facing the fan form a linear oblique line, from the longer fins to the shorter fins, with respect to a line perpendicular to the fins.

4. A cooling device for an electronic device comprising:

a heat sink and a fan arranged adjacent, in a widthwise direction, to the heat sink, wherein the heat sink comprises a generally rectangular flat base, a plurality of fins provided on the surface of the base in parallel to each other and a single protrusion provided on the surface of the base on the side which the fins are provided along the substantially overall width of the base in the transverse direction to the fins, wherein the fins are arranged in parallel to each other, configured shorter on one side of the base, configured longer on the other side of the base at an upstream side of an air flow from a fan, and arranged so that the ends of the fins facing the fan form a linear oblique line, from the longer fins to the shorter fins, with respect to a line perpendicular to the fins.

5. An electronic device comprising:

an electronic member, a heat sink made to come into contact with the electronic member and a fan arranged adjacent, in a widthwise direction, to the heat sink, wherein the heat sink comprises a generally rectangular flat base, a plurality of fins provided on the surface of the base in parallel to each other and a single protrusion provided on the surface of the base on the side which the fins are provided along the substantially overall width of the base in the transverse direction to the fins, wherein a width of said protrusion is equal to or slightly larger than a width of a chip of the electronic member, wherein the fins are configured shorter on one side of the flat base, configured longer on the other side of the flat base at an upstream side of an air flow from a fan, and arranged so that the ends of the fins facing the fan form a linear oblique line, from the longer fins to the shorter fins, with respect to a line perpendicular to the fins.

6. An electronic device as set forth in claim 5, wherein the protrusion is arranged at a position corresponding to the electronic member.

7. An electronic device comprising:

an electronic member, a heat sink made to come into contact with the electronic member and a fan arranged adjacent, in a widthwise direction, to the heat sink, wherein the heat sink comprises a generally rectangular flat base, a plurality of fins provided on a first surface of the base in parallel to each other and a single protrusion provided on a second surface of the base opposite to the first surface, wherein the protrusion is provided along the substantially overall width of the base in the transverse direction to the fins, wherein a width of said protrusion is equal to or slightly larger than a width of a chip of the electronic member, wherein the protrusion comes into contact with the electronic member, and the fins are configured shorter on one side of the flat base, configured longer on the other side of the flat base at an upstream side of an air flow from a fan, and arranged so that the ends of the fins facing the fan form a linear oblique line, from the longer fins to the shorter fins, with respect to a line perpendicular to the fins.

8. A heat sink comprising:

a generally rectangular flat base, a plurality of fins provided on a first surface of the base parallel to each other, a first protrusion provided on the first surface of the base along the substantially overall width of the base in the transverse direction to the plurality of fins, and a second protrusion provided on a second surface of the base opposite to that on which the fins are provided along the substantially overall width of the base parallel to the first protrusion, wherein the fins are configured short on one side of the flat base, configured longer on the other side of the flat base at an upstream side of an air flow from a fan, and arranged so that the ends of the fins facing the fan form a linear oblique line, from the longer fins to the shorter fins, with respect to a line perpendicular to the fins.

9. A heat sink as set forth in claim 8, further comprising:

a pair of guide walls provided on the surface of the base on both side thereof in parallel to the fins, the first protrusion extending from one of the guide walls to the other, the second protrusion extending from one side edge of the base to the other, and each of the guide walls extends beyond the fins in a lengthwise direction.

10. A cooling device for an electronic device comprising:

a heat sink and a fan arranged adjacent, in a widthwise direction, to the heat sink, wherein the heat sink comprises a generally rectangular flat base, a plurality of fins provided on a first surface of the base in parallel to each other, a first protrusion provided on the first surface of the base along the substantially overall width of the base in the transverse direction to the fins, and a second protrusion provided on a second surface of the base opposite to that on which the fins are provided along substantially the overall width of the base and parallel to the first protrusion, wherein the fins are configured shorter on one side of the flat base, configured longer on the other side of the flat base at an upstream side of an air flow from said fan, and arranged so that the ends of the fins facing the fan form a linear oblique line, from the longer fins to the shorter fins, with respect to a line perpendicular to the fins.

11. An electronic device comprising:

an electronic member, a heat sink made to come into contact with the electronic member, and a fan arranged adjacent, in a widthwise direction, to the heat sink, wherein the heat sink comprises a generally rectangular flat base, a plurality of fins provided on a first surface of the base in parallel to each other, a first protrusion provided on the first surface of the base, along the substantially overall width of the base in the transverse direction to the fins and a second protrusion provided on a second surface of the base opposite to that on which the fins are provided along substantially the overall width of the base in parallel to the first protrusion, wherein a width of said protrusion is equal to or slightly larger than a width of a chip of the electronic member, wherein the fins are configured shorter on one side of the flat base, configured longer on the other side of the flat base at an upstream side of an air flow from said fan, and arranged so that the ends of the fins facing the fan form a linear oblique line, from the longer fins to the shorter fins, with respect to a line perpendicular to the fins.

12. An electronic device as set forth in claim 11, wherein the first protrusion is arranged at a position corresponding to the electronic member and the second protrusion comes into contact with the electronic member.

13. A heat sink comprising:
a generally rectangular base;
a plurality of fins provided on the surface of the base in parallel to each other; and
a single protrusion provided on the surface of the base along the substantially overall width of the base in the transverse direction to the fins,
wherein the fins are configured shorter on one end side of the base, configured longer on the other side of the base at an upstream side of an airflow from a fan, and arranged so that the ends of the fins facing the fan form a linear oblique line, from the longer fins to the shorter fins, with respect to a line perpendicular to the fins.

14. A heat sink, as set forth in claim 13, further comprising:
a second protrusion provided on the surface of the base opposite to that on which the fins are provided along the substantially overall width of the base in the transverse direction to the fins.

15. A cooling device for an electronic device comprising:
a heat sink; and
a fan arranged adjacent to the heat sink,
wherein the heat sink comprises:
a generally rectangular flat base;
a plurality of fins provided on the surface of the base in parallel to each other; and
a single protrusion provided on the surface of the base along substantially the overall width of the base in the transverse direction to the fins,
wherein the fins are configured shorter on one end side of the base, configured longer on the other side of the base at an upstream side of an airflow from a fan, and arranged so that the ends of the fins facing the fan form a linear oblique line, from the longer fins to the shorter fins. with respect to a line perpendicular to the fins.

16. A cooling device for an electronic device as set forth in claim 15, further comprising:
a second protrusion provided on the surface of the base opposite to that on which the fins are provided along substantially the overall width of the base in the transverse direction to the fins.

17. An electronic device comprising:
an electronic member;
a heat sink made to come into contact with the electronic member; and
a fan arranged adjacent to the heat sink,
wherein the heat sink comprises:
a generally rectangular flat base;
a plurality of fins provided on the surface of the base in parallel to each other, configured shorter on one side of the base, configured longer on the other side of the base at an upstream side of an air flow from said fan, and arranged so that the ends of the fins facing the fan form a linear oblique line, from the longer fins to the shorter fins, with respect to a line perpendicular to the fins; and
a single protrusion provided on the surface of the base along substantially the overall width of the base in the transverse direction to the fins.

18. An electronic device, as set forth in claim 17, further comprising:
a second protrusion provided on the surface of the base opposite to that on which the fins are provided along the substantially overall width of the base in the transverse direction to the fins.

19. A heat sink comprising:
a generally rectangular flat base;
a plurality of fins provided on the surface of the base in parallel to each other;
a protrusion provided on the surface of the base along substantially the overall width of the base in the transverse direction to the fins; and
a cover for covering the fins,
wherein the cover has a flap extending in parallel to the protrusion in order to guide a current of air toward the protrusion and
wherein the flap has an inclined surface at a position corresponding to the protrusion or at a position on the upstream side of the protrusion in the direction of the current of air when in use.

20. A heat sink as set forth in claim 19, further comprising:
a pair of guide walls provided on the surface of the base on both sides thereof in parallel to the fins, the flap extending from one of the pair of guide walls to the other.

21. A heat sink as set forth in claim 19, wherein the fins becoming gradually shorter on one end side of the base.

22. A heat sink as set forth in claim 19, further comprising:
a second protrusion provided on the surface of the base opposite to that on which the plurality of fins are provided along substantially the overall width of the base in the transverse direction to the fins.

23. A cooling device for an electronic device comprising:
a heat sink; and
a fan arranged adjacent to the heat sink,
wherein the heat sink comprises:
a generally rectangular flat base;
a plurality of fins provided on the surface of the base in parallel to each other, configured shorter on one side of the base, configured longer on the other side of the base at an upstream side of an air flow from said fan, and arranged so that the ends of the fins facing the fan form a linear oblique line, from the longer fins to the shorter fins, with respect to a line perpendicular to the fins;
a protrusion provided on the surface of the base along the substantially overall width of the base in the transverse direction to the fins; and
a cover for covering the fins, the cover having a flap extending parallel to the protrusion in order to guide a current of air toward the protrusion,
wherein the flap has an inclined surface at a position corresponding to the protrusion or at a position on the upstream side of the protrusion in the direction of the current of air when in use.

24. A cooling device for an electronic device as set forth in claim 23, further comprising:
a pair of guide walls provided on both sides thereof on the surface of the base in parallel to the fins, the flap extending from one of the pair of guide walls to the other.

25. A cooling device for an electronic device as set forth in claim 23, wherein the fins become shorter on one end side of the base.

26. A cooling device for an electronic device as set forth in claim 23, further comprising:
a second protrusion provided on the surface of the base opposite to that on which the fins are provided along substantially the overall width of the base in the transverse direction to the fins.

27. An electronic device comprising:
an electronic member;
a heat sink made to come into contact with the electronic member;
and a fan arranged adjacent to the heat sink,
wherein the heat sink comprises:
a generally rectangular flat base;

a plurality of fins provided on the surface of the base in parallel to each other, configured shorter on one side of the base, configured longer on the other side of the base at an upstream side of an air flow from said fan, and arranged so that the ends of the fins facing the fan form a linear oblique line, from the longer fins to the shorter fins, with respect to a line perpendicular to the fins;

a protrusion provided on the surface of the base along substantially overall width of the base in the transverse direction to the fins; and a cover for covering the fins, the cover having a flap extending in parallel to the protrusion in order to guide a current of air toward the protrusion, wherein the flap has an inclined surface at a position corresponding to the protrusion or at a position on the upstream side of the protrusion in the direction of the current of air when in use.

28. An electronic device as set forth in claim 27, further comprising:

a pair of guide walls provided on the surface of the base on both sides thereof in parallel to the fins and the flap extends from one of the pair of guide walls to the other.

29. An electronic device as set forth in claim 27, wherein the fins become gradually shorter on one end side of the base.

30. An electronic device as set forth in claim 27, further comprising a second protrusion provided on the surface of the base opposite to that on which the fins are provided along substantially the overall width of the base in the transverse direction to the fins.

* * * * *